United States Patent
Lee et al.

(10) Patent No.: US 11,571,999 B2
(45) Date of Patent: Feb. 7, 2023

(54) SYSTEM AND METHOD FOR ADJUSTING PROPERTIES OF SEAT FOR VEHICLES

(71) Applicants: Hyundai Motor Company, Seoul (KR); Kia Motors Corporation, Seoul (KR)

(72) Inventors: Baek Hee Lee, Suwon-Si (KR); Gyu Ho Chung, Yongin-Si (KR); Jong Hun Lee, Hwaseong-Si (KR); Yo Seob Lee, Incheon (KR); Hyun Kyu Park, Hwaseong-Si (KR); Min Hyuk Kwak, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 263 days.

(21) Appl. No.: 16/909,810

(22) Filed: Jun. 23, 2020

(65) Prior Publication Data
US 2021/0162900 A1 Jun. 3, 2021

(30) Foreign Application Priority Data
Dec. 2, 2019 (KR) .......... 10-2019-0158008

(51) Int. Cl.
| | |
|---|---|
| *A47C 7/72* | (2006.01) |
| *B60N 2/56* | (2006.01) |
| *B60N 2/70* | (2006.01) |
| *H01L 35/32* | (2006.01) |
| *H01L 35/02* | (2006.01) |

(Continued)

(52) U.S. Cl.
CPC .............. *B60N 2/5685* (2013.01); *B60N 2/70* (2013.01); *G01K 7/22* (2013.01); *H01L 35/02* (2013.01); *H01L 35/30* (2013.01); *H01L 35/32* (2013.01); *B60N 2/22* (2013.01); *B60N 2002/026* (2013.01);
(Continued)

(58) Field of Classification Search
CPC .. B60N 2/5685; B60N 2/5657; B60N 2/5635; B60N 2/002; B60N 2/5642; B60N 2/5678; B60N 2/56
See application file for complete search history.

(56) References Cited

U.S. PATENT DOCUMENTS

| | | | |
|---|---|---|---|
| 6,700,052 B2 * | 3/2004 | Bell ........................ | H01L 35/32 136/211 |
| 9,751,380 B2 * | 9/2017 | Jablonski ........... | B60H 1/00985 |

(Continued)

*Primary Examiner* — Shin H Kim
(74) *Attorney, Agent, or Firm* — Morgan, Lewis & Bockius LLP

(57) ABSTRACT

A system for adjusting properties of a seat for a vehicle, may include thermoelement modules configured to have a structure in which a plurality of flexible thermoelements is connected by conductive wires to each other, and mounted in a seat foam pad of the seat; a property adjustment region input unit configured to select a property adjustment region of the seat foam pad; a property adjustment amount input unit configured to input a target property adjustment amount of the seat foam pad; and a controller connected to the thermoelement modules, the property adjustment region input unit and the property adjustment amount input unit, and configured to control an amount of current supplied to some or all of the flexible thermoelements according to output signals from the property adjustment region input unit and the property adjustment amount input unit.

13 Claims, 4 Drawing Sheets

(51) Int. Cl.
  *H01L 35/30*  (2006.01)
  *G01K 7/22*  (2006.01)
  *G01K 7/02*  (2021.01)
  *B60N 2/02*  (2006.01)
  *B60N 2/22*  (2006.01)

(52) U.S. Cl.
  CPC ........ *B60N 2002/0268* (2013.01); *G01K 7/02* (2013.01)

(56) References Cited

U.S. PATENT DOCUMENTS

| | | | | |
|---|---|---|---|---|
| 10,293,718 | B1* | 5/2019 | Ilievski | B60N 2/501 |
| 10,647,251 | B2* | 5/2020 | Hwang | G01S 15/88 |
| 10,670,448 | B2* | 6/2020 | Aina | G01G 19/4142 |
| 10,739,184 | B2* | 8/2020 | Aina | G01V 9/00 |
| 10,940,831 | B2* | 3/2021 | Ichinose | B62D 15/0285 |
| 10,967,758 | B2* | 4/2021 | Mizoi | A61H 1/00 |
| 11,047,729 | B2* | 6/2021 | Aina | B60R 21/01516 |
| 2007/0158981 | A1* | 7/2007 | Almasi | B60N 2/5614 |
| | | | | 297/180.12 |
| 2011/0226751 | A1* | 9/2011 | Lazanja | A47C 7/748 |
| | | | | 219/217 |
| 2014/0097651 | A1* | 4/2014 | Fortune | B60N 2/002 |
| | | | | 297/180.12 |
| 2014/0333107 | A1* | 11/2014 | Seki | B60N 2/161 |
| | | | | 297/284.1 |
| 2016/0176264 | A1* | 6/2016 | Jablonski | B60H 1/00985 |
| | | | | 165/203 |
| 2018/0304774 | A1* | 10/2018 | Mizoi | A61B 5/1126 |
| 2019/0003876 | A1* | 1/2019 | Aina | G01G 19/4142 |
| 2019/0003877 | A1* | 1/2019 | Aina | B60R 21/01516 |
| 2019/0184899 | A1* | 6/2019 | Hwang | G01S 7/539 |
| 2019/0212849 | A1* | 7/2019 | Patel | B60N 2/0228 |
| 2019/0299830 | A1* | 10/2019 | Alequin | B60N 2/56 |
| 2019/0366799 | A1* | 12/2019 | Czerwonka | B60N 2/5678 |
| 2019/0371995 | A1* | 12/2019 | Tait | B60N 2/5642 |
| 2020/0090437 | A1* | 3/2020 | Ichinose | G07C 9/00309 |
| 2020/0370945 | A1* | 11/2020 | Aina | G01G 19/44 |
| 2021/0019042 | A1* | 1/2021 | Kwak | G06F 3/04886 |
| 2021/0039537 | A1* | 2/2021 | Kaku | A61B 5/1036 |
| 2021/0078448 | A1* | 3/2021 | Kaku | G01P 13/00 |
| 2021/0162900 | A1* | 6/2021 | Lee | G01K 13/00 |
| 2021/0221259 | A1* | 7/2021 | Mizoi | B60N 2/90 |
| 2021/0237620 | A1* | 8/2021 | Mizoi | A61B 5/6893 |
| 2022/0016999 | A1* | 1/2022 | Burk | G06V 40/172 |
| 2022/0063403 | A1* | 3/2022 | Shin | B60N 2/0228 |
| 2022/0111296 | A1* | 4/2022 | Kaku | A63F 13/98 |

\* cited by examiner

SYSTEM AND METHOD FOR ADJUSTING PROPERTIES OF SEAT FOR VEHICLES

CROSS-REFERENCE TO RELATED APPLICATION

The present application claims priority to Korean Patent Application No. 10-2019-0158008 filed on Dec. 2, 2019, the entire contents of which is incorporated herein for all purposes by this reference.

BACKGROUND OF THE INVENTION

Field of the Invention

The present invention relates to a system and method for adjusting properties of a seat for a vehicle. More particularly, it relates to a system and method for adjusting properties of a seat for a vehicle in which properties of a seat foam pad, such as a degree of cushioning thereof, may be easily adjusted using flexible thermoelements.

Description of Related Art

As is well known, a seat for a vehicle includes a seat cushion configured to support the lower portion of a passenger body, a seat back configured to support the upper portion of the passenger body and a headrest configured to support the passenger neck and head, and various convenience apparatuses for realizing a seat posture are mounted inside and outside the present seat.

A passenger sitting on the seat may realize a desired sitting posture by adjusting a reclining angle of the seat back, a forward and backward position of the seat, a tilting angle of the seat cushion, a position of a lumbar support, etc.

However, although various apparatuses for realizing various passenger postures of the seat are mounted in the conventional seat, the conventional seat is disadvantageous in that it cannot satisfy passenger's delicate emotional control desires, such as a degree of cushioning and a detect of fitting depending on a passenger's body type and a situation, and there is no method for satisfying these emotional control desires.

Furthermore, when the passenger maintains a state in which the passenger's body contacts with the seat for a long time during a long drive, the passenger's body pressure is changed without a change in supporting force of the seat for supporting a specific portion (for example, the hips, the back or the waist) of the passenger's body, and may thus cause discomfort to the passenger.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a system and method for adjusting properties of a seat for a vehicle in which flexible thermoelements are mounted in the seat to easily adjust properties of the entire region or a local region of a seat foam pad, such as a degree of cushioning (a degree of elasticity) thereof, and may thus provide a degree of cushioning and a detect of fitting of the seat to fit a passenger's body type and a situation and thereby satisfy passenger's emotional control desires.

Various aspects of the present invention are directed to providing a system for adjusting properties of a seat for a vehicle, the system including thermoelement modules configured to have a structure in which a plurality of flexible thermoelements is connected by conductive wires to each other, and mounted in a seat foam pad, a property adjustment region input unit configured to select a property adjustment region of the seat foam pad, a property adjustment amount input unit configured to input a target property adjustment amount of the seat foam pad, and a controller connected to the thermoelement modules, the property adjustment region input unit and the property adjustment amount input unit, and configured to control an amount of current supplied to some or all of the flexible thermoelements according to output signals from the property adjustment region input unit and the property adjustment amount input unit.

In an exemplary embodiment of the present invention, the flexible thermoelements may include Peltier elements configured to be mounted at designated intervals in the seat foam pad of each of a seat back and a seat cushion of the seat.

In another exemplary embodiment of the present invention, the property adjustment region input unit may include a display device configured to display a seat image in which mounting positions of the flexible thermoelements are marked.

In yet another exemplary embodiment of the present invention, the property adjustment amount input unit may include a dial rotatably mounted on a side portion of the seat back.

In yet another exemplary embodiment of the present invention, when the dial is turned in one direction thereof, the dial may output a first target property adjustment amount signal for adjusting a degree of cushioning of the seat foam pad to a softer state to the controller, and when the dial is turned in a remaining direction thereof, the dial may output a second target property adjustment amount signal for adjusting the degree of cushioning of the seat foam pad to a harder state to the controller.

In still yet another exemplary embodiment of the present invention, each of the thermoelement modules may include a thermistor configured to measure a temperature change of an entire region or a local region of the seat foam pad using a resistance value.

Various aspects of the present invention are directed to providing a method for adjusting properties of a seat for a vehicle, the method including selecting a property adjustment region of a seat foam pad in the seat using a property adjustment region input unit, selecting a target property adjustment amount of the seat foam pad using a property adjustment amount input unit, controlling, by a controller, an amount of current supplied to some or all of a plurality of flexible thermoelements connected to the controller and mounted in the seat foam pad according to input signals through the property adjustment region input unit and the property adjustment amount input unit, and adjusting a degree of cushioning of a local region or an entire region of the seat foam pad through an exothermic or endothermic reaction of the flexible thermoelements depending on control of the amount of the supplied current.

In an exemplary embodiment of the present invention, in the adjusting the degree of cushioning, the degree of cushioning of the seat foam pad may be adjusted to a softer state in stages through the exothermic reaction of the flexible thermoelements.

In another exemplary embodiment of the present invention, in the adjusting the degree of cushioning, the degree of cushioning of the seat foam pad may be adjusted to a harder state in stages through the endothermic reaction of the flexible thermoelements.

In yet another exemplary embodiment of the present invention, the method may further include measuring, by a thermistor, a temperature change in the local region or the entire region of the seat foam pad using a resistance value during the exothermic or endothermic reaction of the flexible thermoelements, and stopping, by the controller, supply of current to the flexible thermoelements when the measured resistance value exceeds a reference resistance value.

Other aspects and exemplary embodiments of the present invention are discussed infra.

The above and other features of the present invention are discussed infra.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
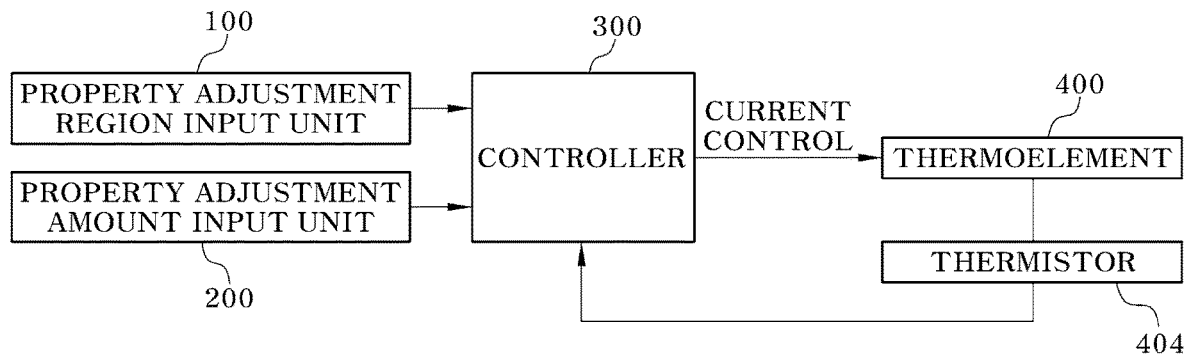
FIG. 1 is a control block diagram illustrating a system for adjusting properties of a seat for a vehicle according to an exemplary embodiment of the present invention.

It may be understood that the appended drawings are not necessarily to scale, presenting a somewhat simplified representation of various exemplary features illustrative of the basic principles of the present invention. The specific design features of the present invention as included herein, including, for example, specific dimensions, orientations, locations, and shapes, will be determined in portion by the particular intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Figure 2:
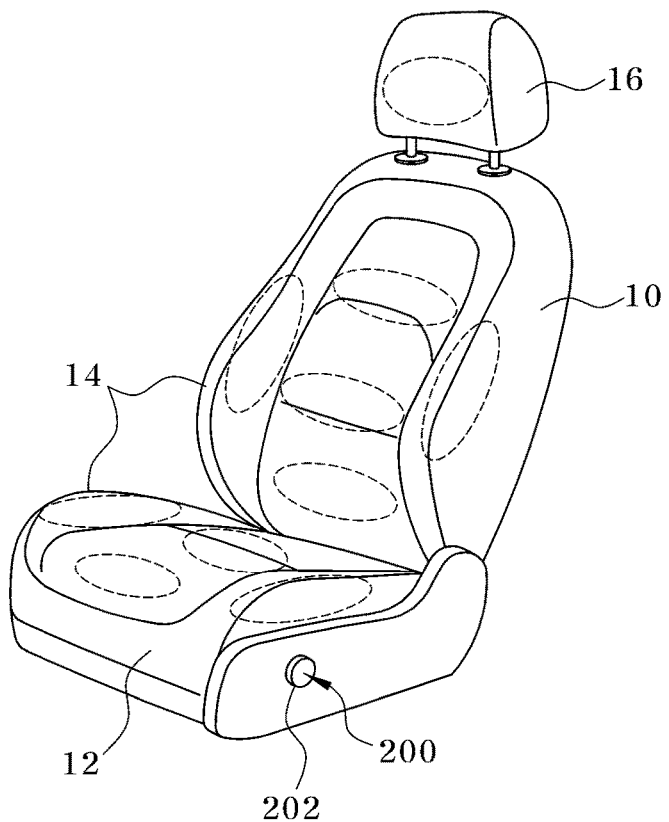
FIG. 2 is a schematic view exemplarily illustrating mounting positions of flexible thermoelements in the configuration of the system according to an exemplary embodiment of the present invention.

FIG. 1 is a control block diagram illustrating a system for adjusting properties of a seat for a vehicle according to an exemplary embodiment of the present invention, and FIG. 2 is a schematic view exemplarily illustrating mounting positions of flexible thermoelements in the configuration of the system according to an exemplary embodiment of the present invention.

As shown in FIG. 1, a system for adjusting properties of a seat for a vehicle according to an exemplary embodiment of the present invention includes a property adjustment region input unit 100 configured to select a property adjustment region of a seat foam pad 18 (in FIG. 5), a property adjustment amount input unit 200 configured to input a target property adjustment amount of the seat foam pad, and a controller 300 configured to control the amount of current supplied to some or all of a plurality of flexible thermoelements 402 mounted in the seat foam pad 18 based on input signals through the property adjustment region input unit 100 and the property adjustment amount input unit 200.

Referring to FIG. 2, the seat for vehicles includes a seat back 10, a seat cushion 12, bolsters 14 and a headrest 16, and oval portions shown in a dotted line of FIG. 2 indicate regions in which thermoelement modules 400 configured to adjust a degree of cushioning (a degree of elasticity), i.e., one of properties of the seat foam pad 18, to a softer state or a harder state in stages than a reference state are disposed.

Figure 5:
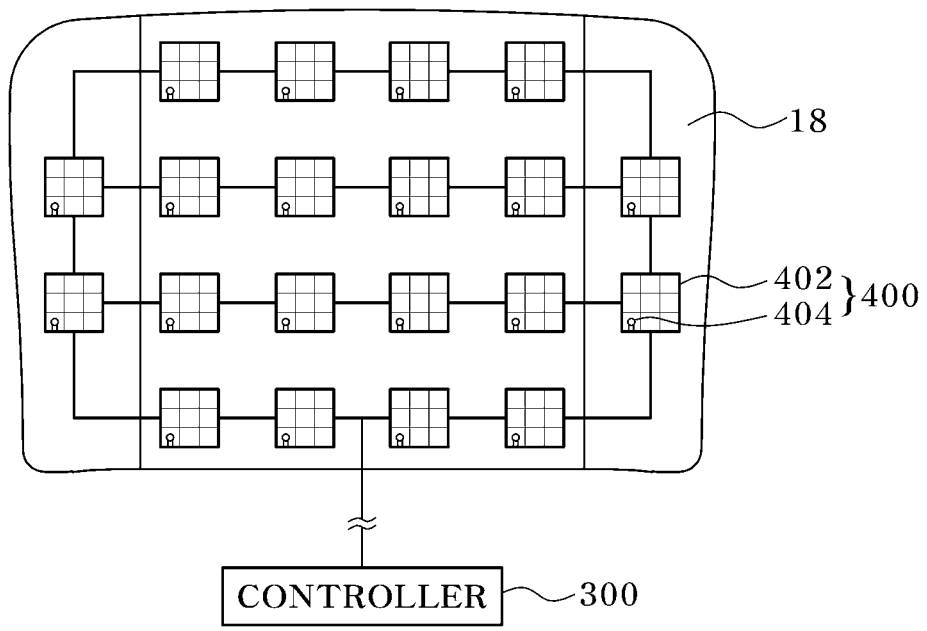
FIG. 5 is a plan view exemplarily illustrating a mounting arrangement of the flexible thermoelements in the configuration of the system according to an exemplary embodiment of the present invention.
Figure 6:
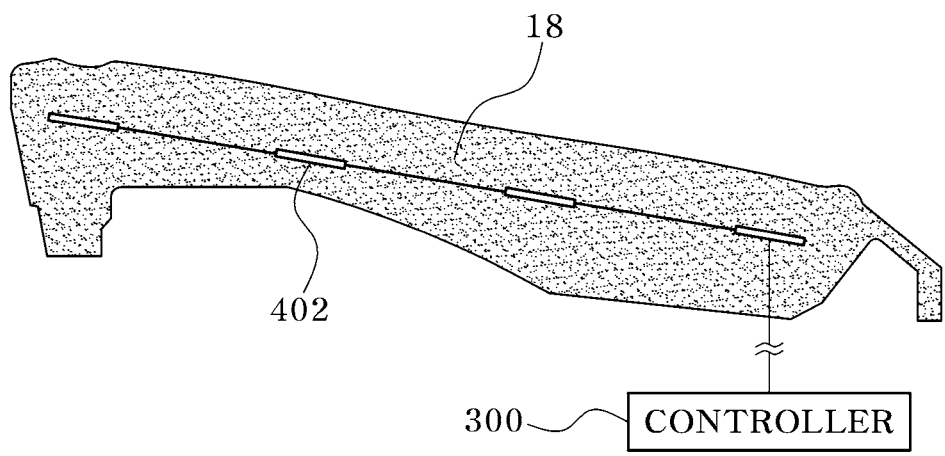
FIG. 6 is a cross-sectional view of a seat cushion in which the flexible thermoelements are mounted, in the configuration of the system according to an exemplary embodiment of the present invention.

The thermoelement module 400 has a structure in which a plurality of flexible thermoelements 402 is connected by conductive wires to each other, and is mounted in the seat foam pad 18, as shown in FIG. 5 and FIG. 6.

Figure 4:
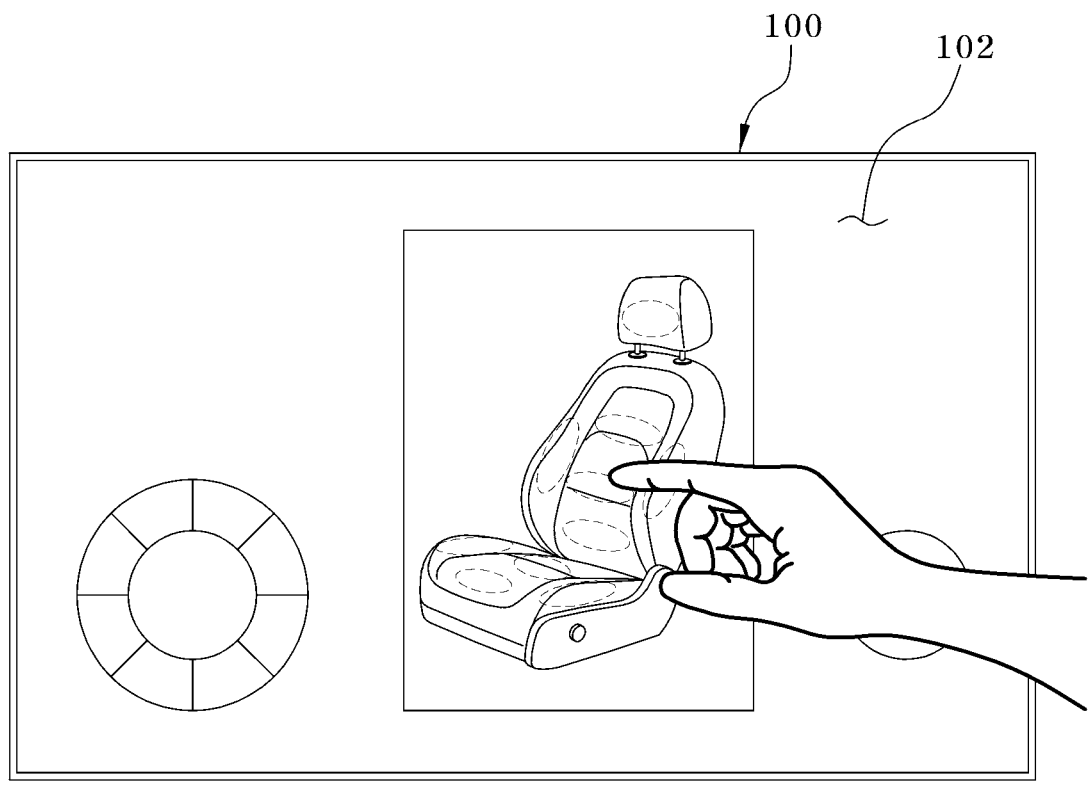
FIG. 4 is a schematic view exemplarily illustrating one example of a property adjustment region input unit of the system according to an exemplary embodiment of the present invention.

Here, the property adjustment region input unit 100 may employ a display device 102 configured to display a seat image in which regions, in which the flexible thermoelements 402 are distributed and mounted (the oval portions shown in FIG. 4), are separately marked, as shown in FIG. 4.

Furthermore, the property adjustment amount input unit 200 may employ a dial 202 which is rotatably mounted on a side portion of the seat cushion 12, as shown in FIG. 2.

Figure 3:
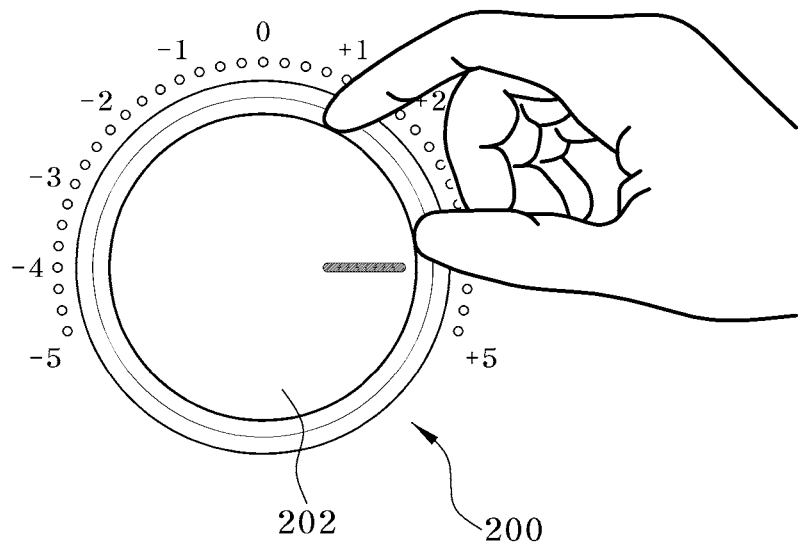
FIG. 3 is a schematic view exemplarily illustrating a dial in the configuration of the system according to an exemplary embodiment of the present invention.

Referring to FIG. 3, the external circumferential portion of the dial 202 (the side surface portion of the seat back) is marked with marks configured to respectively indicate degrees of cushioning (degrees of elasticity), corresponding to one of properties of the seat foam pad 18, in stages.

In more detail, one side of the external circumferential portion of the dial 202 is marked with the numbers −1 to −5 which indicate increasing softness in the degree of cushioning in stages, and the other side of the external circumferential portion of the dial 202 is marked with the number +1 to +5 which indicate increasing hardness in the degree of cushioning in stages.

When a user turns the dial 202 in one direction thereof, the dial 202 outputs a target property adjustment amount signal for adjusting the degree of cushioning of the seat foam pad 18 to a softer state in stages to the controller 300.

On the other hand, when a user turns the dial 202 in the other direction thereof, the dial 202 outputs a target property adjustment amount signal for adjusting the degree of cushioning of the seat foam pad 18 to a harder state in stages to the controller 300.

Furthermore, when the user touches and selects a desired portion of the seat image through the display device 102 employed as the property adjustment region input unit 100, the display device 102 outputs a signal for selecting a property adjustment region of the seat foam pad 18 to the controller 300.

Here, the thermoelement module 400 has a structure in which the flexible thermoelements 402 are connected by the conductive wires, and is mounted in the seat foam pad 18, as shown in FIG. 5 and FIG. 6.

The flexible thermoelements 402 may employ conventional Peltier elements which are mounted at designated intervals in the seat foam pad 18 of each of the seat back 10 and the seat cushion 12, and execute an exothermic or endothermic reaction depending on a current flow direction thereof.

Furthermore, a negative temperature coefficient (NTC) thermistor 404, which measures a temperature change of the entire region or a local region of the seat foam pad 18 using a resistance value and then transmits the measured resistance value to the controller 300, is attached to the thermoelement module 400 at a designated position.

Therefore, the controller 300 may control the amount of current supplied to some or all of the flexible thermoelements 402 mounted in the seat foam pad 18 according to signals output from the property adjustment region input unit 100 and the property adjustment amount input unit 200, and accordingly, the degree of cushioning in a local region or the entire region of the seat foam pad 18 may be adjusted through the exothermic or endothermic reaction of the flexible thermoelements 402.

For example, the degree of cushioning of the seat foam pad 18 may be adjusted to the softer state in stages through the exothermic reaction of the flexible thermoelements 402, or the degree of cushioning of the seat foam pad 18 may be adjusted to the harder state in stages through the endothermic reaction of the flexible thermoelements 402.

The seat foam pad 18 is formed of polyurethane, and the properties of the seat foam pad 18, such as the degree of cushioning thereof, may be changed depending on temperature. As a basis of the present property change, a static load measurement test depending on the temperature of the seat foam pad 18 was conducted, and results of the test are set forth in Table 1 below.

Here, the static load measurement test was performed by preparing a seat foam pad specimen having a size of 400×400×100 mm and measuring displacement values of the specimen when the specimen was pressurized with the maximum load of 100 kgf and was then pressurized with the maximum load of 55 kgf at temperatures of 18° C. and 22° C. using a static load measurement apparatus.

TABLE 1

|   | Displacement value at 18° C. | Displacement value at 22° C. | Difference |
|---|---|---|---|
| 1 | 37.4 mm | 39.4 mm | +2.0 mm |
| 2 | 40.1 mm | 42.7 mm | +2.6 mm |
| 3 | 48.7 mm | 51.5 mm | +2.8 mm |

As stated in Table 1, it may be understood that a difference between the displacement value measured at the temperature of 18° C. and the displacement value measured at the temperature of 22° C. occurs, and it proves that the degree of cushioning of the seat foam pad 18 varies depending on temperature.

Here, a method for adjusting properties of a seat for a vehicle based on the above-described configuration according to an exemplary embodiment of the present invention will be described.

Figure 7:
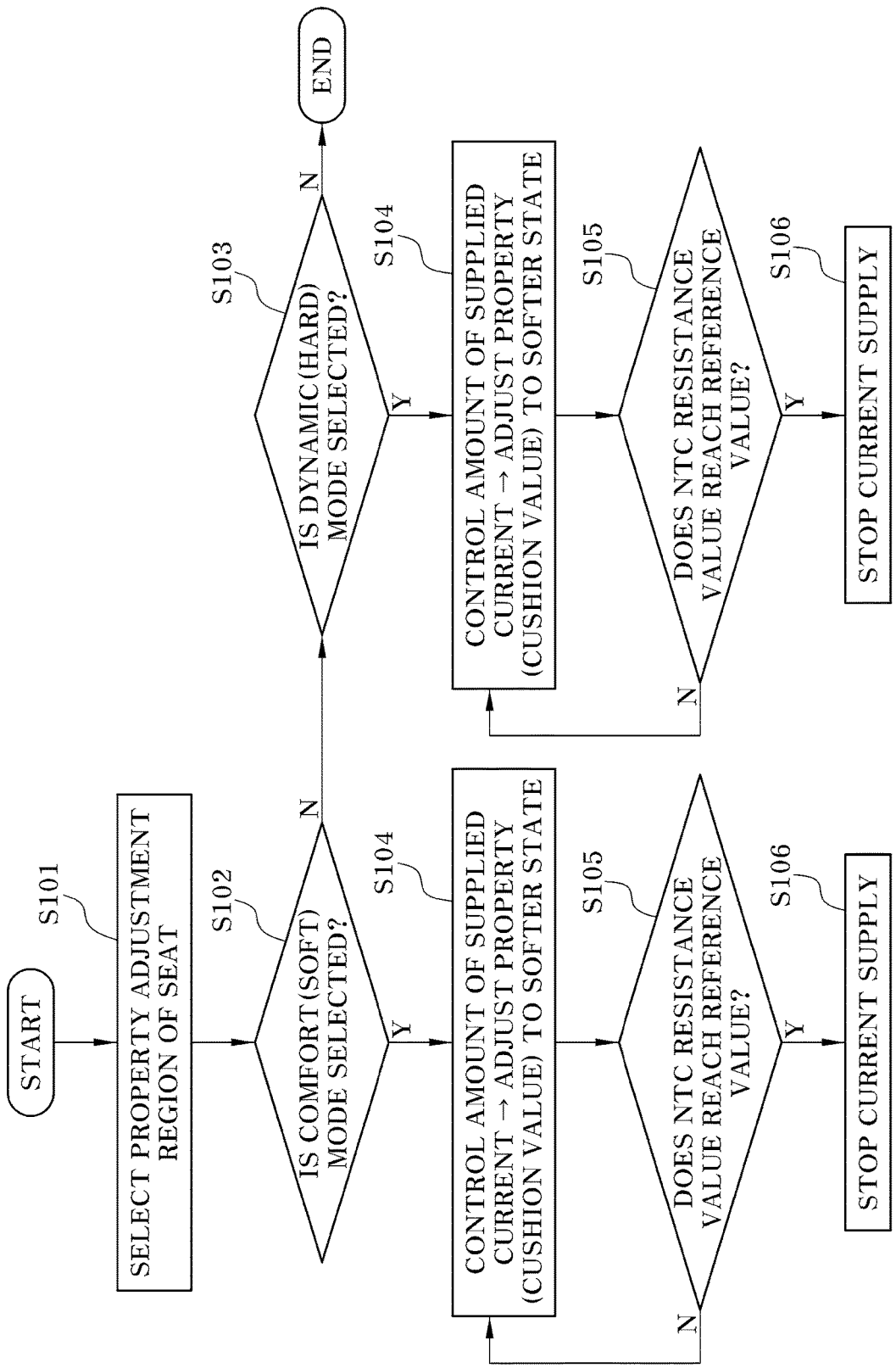
FIG. 7 is a flowchart representing an exemplary method for operating the system according to an exemplary embodiment of the present invention.

FIG. 7 is a flowchart representing an exemplary method for operating the system according to an exemplary embodiment of the present invention.

First, a user selects a property adjustment region of the seat (S101).

That is to say, the user selects a region of the seat foam pad 18 for which it is desired to adjust a degree of cushioning to a softer state or a harder state.

For example, if the user wants to adjust the degree of cushioning of a region of the seat that contacts with the hips, the user may select the corresponding region of the seat by touching the flexible thermoelements which are marked in a portion of the seat image corresponding to the region of the seat contacting with the hips (the oval portions shown in FIG. 4) while viewing the seat image displayed through the display device 102 in a vehicle.

Thereafter, the user inputs a property adjustment amount of the seat (S102 and S103).

That is, the user selects a comfort mode for adjusting the degree of cushioning of the seat foam pad 18 to the softer state by turning the dial 202 (S102), or selects a dynamic mode for adjusting the degree of cushioning of the seat foam pad 18 to the harder state by turning the dial 202 (S103).

For example, if the user selects the comfort mode for adjusting the degree of cushioning of the seat foam pad 18 to the softer state, the user turns the dial 202 to a desired angle in the direction in which the numbers −1 to −5 are marked, and if the user selects the dynamic mode for adjusting the degree of cushioning of the seat foam pad 18 to the harder state, the user turns the dial 202 to a desired angle in the direction in which the numbers +1 to +5 are marked.

Thereafter, the controller 300 controls the amount of current supplied to some or all of the flexible thermoelements 402 mounted in the seat foam pad 18, based on a property adjustment region selection signal input through the property adjustment region input unit 100 and a property adjustment amount signal input through the dial 202 (S104).

Accordingly, the degree of the cushioning of a local region or the entire region of the seat foam pad 18 may be adjusted through the exothermic or endothermic reaction of the flexible thermoelements 402.

For example, the degree of cushioning of the seat foam pad 18 may be adjusted to the softer state in stages through the exothermic reaction of the flexible thermoelements 402, or the degree of cushioning of the seat foam pad 18 may be adjusted to the harder state in stages through the endothermic reaction of the flexible thermoelements 402.

When the thermistor 404 measures a temperature change of the entire region or the local region of the seat foam pad 18 using a resistance value and transmits the measured resistance value to the controller 300 during the exothermic or endothermic reaction of the flexible thermoelements 402, the controller 300 determines whether or not the measured resistance value exceeds a reference resistance value (S105).

As results of the determination, when the resistance value measured by the thermistor 404 reaches the reference resistance value, the controller 300 stops supply of current to the flexible thermoelements 402 (S106).

As is apparent from the above description, a system and method for adjusting properties of a seat for a vehicle according to an exemplary embodiment of the present invention may provide the following effects.

In the system and method according to the present invention, flexible thermoelements are mounted in the seat to adjust a degree of cushioning (a degree of elasticity) of the entire region or a local region of a seat foam pad to fit a passenger's body type and a situation, being configured for satisfying passenger's emotional control desires, such as the degree of cushioning and a detect of fitting of the seat.

In addition, the term "controller" refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present invention. The controller according to exemplary embodiments of the present invention may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors.

The controller may be at least one microprocessor operated by a predetermined program which may include a series of commands for carrying out a method in accordance with various exemplary embodiments of the present invention.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A system of adjusting properties of a seat for a vehicle, the system comprising:
    thermoelement modules including a plurality of flexible thermoelements which is connected by conductive wires to each other, and mounted in a seat foam pad of the seat;
    a property adjustment region input unit configured to select a property adjustment region of the seat foam pad;
    a property adjustment amount input unit configured to input a target property adjustment amount of the seat foam pad; and
    a controller connected to the thermoelement modules, the property adjustment region input unit and the property adjustment amount input unit, and configured to control an amount of current supplied to at least one of the flexible thermoelements according to output signals from the property adjustment region input unit and the property adjustment amount input unit,
    wherein each of the thermoelement modules includes a thermistor configured to measure a temperature change of an entire region or a local region of the seat foam pad using a resistance value of the thermistor.

2. The system of claim 1, wherein the flexible thermoelements include Peltier elements mounted at predetermined intervals in the seat foam pad of at least one of a seat back and a seat cushion of the seat.

3. The system of claim 1, wherein the property adjustment region input unit includes a display device configured to display a seat image in which mounting positions of the flexible thermoelements are marked.

4. The system of claim 1, wherein the property adjustment amount input unit includes a dial rotatably mounted on a side portion of a seat back.

5. The system of claim 4, wherein, when the dial is turned in one direction thereof, the dial is configured to output a first target property adjustment amount signal for adjusting a degree of cushioning of the seat foam pad to a softer state than a reference state, to the controller, and when the dial is turned in a remaining direction thereof, the dial is configured to output a second target property adjustment amount signal for adjusting the degree of cushioning of the seat foam pad to a harder state than the reference state, to the controller.

6. The system of claim 1, wherein the thermistor is connected to the controller and configured to send the measured temperature change to the controller.

7. The system of claim 6,
    wherein the thermistor is configured to measure the temperature change in the local region or the entire region of the seat foam pad using the resistance value during an exothermic or endothermic reaction of the flexible thermoelements, and
    wherein the controller is configured to stop supply of the current to the flexible thermoelements when the measured resistance value is greater than a reference resistance value.

8. The system of claim 1, wherein the seat foam pad is formed of polyurethane.

9. A method of adjusting properties of a seat for a vehicle, the method comprising:
    selecting, by a property adjustment region input unit, a property adjustment region of a seat foam pad in the seat;
    selecting, by a property adjustment amount input unit, a target property adjustment amount of the seat foam pad;
    controlling, by a controller connected to the property adjustment region input unit and the property adjustment amount input unit, an amount of current supplied to at least one of flexible thermoelements connected to the controller and mounted in the seat foam pad, according to input signals received from the property adjustment region input unit and the property adjustment amount input unit; and
    adjusting, by the controller, a degree of cushioning of a local region or an entire region of the seat foam pad through an exothermic or endothermic reaction of the flexible thermoelements depending on control of the amount of the supplied current.

10. The method of claim 9, wherein, in the adjusting the degree of cushioning, the degree of cushioning of the seat foam pad is adjusted to a softer state than a reference state in stages through the exothermic reaction of the flexible thermoelements.

11. The method of claim 9, wherein, in the adjusting the degree of cushioning, the degree of cushioning of the seat foam pad is adjusted to a harder state than a reference state in stages through the endothermic reaction of the flexible thermoelements.

12. The method of claim 9, further including:
  measuring, by a thermistor connected to the controller, a temperature change in the local region or the entire region of the seat foam pad using a resistance value during the exothermic or endothermic reaction of the flexible thermoelements; and
  stopping, by the controller, supply of the current to the flexible thermoelements when the measured resistance value is greater than a reference resistance value.

13. The method of claim 9, wherein the seat foam pad is formed of polyurethane.

* * * * *